(12) United States Patent
Drennan et al.

(10) Patent No.: US 12,007,429 B2
(45) Date of Patent: Jun. 11, 2024

(54) APPARATUS AND METHOD FOR MANAGING POWER OF TEST CIRCUITS

(71) Applicant: IC ANALYTICA, LLC, Austin, TX (US)

(72) Inventors: Patrick G. Drennan, Gilbert, AZ (US); Joseph S. Spector, Austin, TX (US); Richard Wunderlich, Austin, TX (US)

(73) Assignee: IC ANALYTICA, LLC, Austin, TX (US)

( * ) Notice: Subject to any disclaimer, the term of this patent is extended or adjusted under 35 U.S.C. 154(b) by 0 days.

(21) Appl. No.: 17/848,972

(22) Filed: Jun. 24, 2022

(65) Prior Publication Data

US 2022/0413037 A1    Dec. 29, 2022

Related U.S. Application Data

(60) Provisional application No. 63/215,060, filed on Jun. 25, 2021.

(51) Int. Cl.
*G01R 31/27* (2006.01)
*G01R 1/073* (2006.01)
*G01R 31/26* (2020.01)

(52) U.S. Cl.
CPC ....... *G01R 31/275* (2013.01); *G01R 1/07342* (2013.01); *G01R 31/2601* (2013.01)

(58) Field of Classification Search
CPC ........ G01R 1/073; G01R 31/26; G01R 31/27; G01R 1/07342; G01R 31/2601; G01R 31/275; G01R 31/2856; G01R 31/31721; G01R 31/318511

USPC .................................................... 324/762.01
See application file for complete search history.

(56) References Cited

U.S. PATENT DOCUMENTS

| | | | | |
|---|---|---|---|---|
| 2002/0145442 | A1* | 10/2002 | Kinoshita | H01L 22/34 324/750.3 |
| 2004/0232446 | A1* | 11/2004 | Nishimura | G01R 31/31713 257/202 |
| 2006/0132167 | A1* | 6/2006 | Chen | G01R 31/3025 324/750.05 |
| 2007/0252611 | A1* | 11/2007 | Kerber | H01L 22/34 324/762.05 |

OTHER PUBLICATIONS

International Search Report and Written Opinion for PCT/US2022/034853, dated Sep. 23, 2022, 6 pages.

* cited by examiner

*Primary Examiner* — Jermele M Hollington
*Assistant Examiner* — Courtney G McDonnough
(74) *Attorney, Agent, or Firm* — Cooley LLP

(57) ABSTRACT

An apparatus has a semiconductor wafer hosting rows and columns of chips, where the rows and columns of chips are separated by scribe lines. Voltage regulators are positioned within the scribe lines. Each voltage regulator is connected to one or more chips. Selection circuitry is positioned within the scribe lines. The selection circuitry governs access to a chip being tested.

2 Claims, 7 Drawing Sheets

APPARATUS AND METHOD FOR MANAGING POWER OF TEST CIRCUITS

CROSS-REFERENCE TO RELATED INVENTION

This application claims priority to U.S. Provisional Patent Application Ser. No. 63/215,060, filed Jun. 25, 2021, the contents of which are incorporated herein by reference.

FIELD OF THE INVENTION

This invention generally relates to the testing of semiconductor wafers. More specifically, this invention relates to techniques for managing power of test circuits.

BACKGROUND OF THE INVENTION

FIG. 1 illustrates a known semiconductor wafer testing system including test equipment 100 connected to a probe card 102, which makes connections with pads on a wafer 104. FIG. 2 illustrates a semiconductor wafer 104 with individual chips 200. The individual chips 200 form rows and columns of chips which are separated by scribe lines 202. Within scribe line 202 there are test circuits 204. The test circuits 204 are used during wafer level testing. When testing is completed, a saw is used to cut the regions of the scribe lines to divide the individual chips for subsequent packaging. This cutting process destroys the test circuits 204 in the scribe lines. FIG. 3 illustrates a simple test circuit with a gate pad 300, a source pad 302 and a drain pad 304. A probe card needle 306 is connected to the drain pad 304.

FIG. 4 illustrates test equipment 100 comprising Source Measurement Units SMU1, SMU2 and SMU3. The SMU voltages are connected through wire connections from equipment cables, probe tips, probe pads, and on-chip metal routes to the intended circuit, shown here as a single MOSFET transistor with nodes N4, N5, and N6. FIG. 4 illustrates a single gate test circuit for simplicity. It should be appreciated that the test circuit may be of arbitrary complexity.

Current is supplied at a voltage by the SMU to the test circuit, which means the voltage at nodes N4, N5 and N6 will be degraded from the SMU voltages at respective terminals N1, N2 and N3. The resistances R1-R9 are not well controlled. Consequently, current levels are subject to change during the measurement, which means that the voltages at the circuit terminals N4, N5 and N6 have too much variation for practical sensor circuit analysis.

In a typical commercial solution for mitigating the "IR" voltage drop, the SMU's will each have two connections, Force (F) and Sense (S), as shown in FIG. 5. The F side of the SMU is used to apply a given voltage and the current to the circuit is supplied through this link. A separate S side is a high impedance connection to a common node N1, N2 and N3 so that only a negligible amount of current can flow through this branch. Inside the SMU there is a feedback loop that alters the force voltage to compensate for the IR voltage drop through R1F, R2F and R3F so that the intended voltage is realized at the "Kelvin'd" node points N1, N2 and N3. The Kelvin'd node points are established within the equipment above the probe pads, which means that only the IR in the cable resistances is accounted for. Consequently, the IR drop in the remaining resistances R4-R9 are not compensated, which results in an error in the applied voltage to the test circuit.

An improvement upon the system of FIG. 5 is shown in FIG. 6. In FIG. 6, the F and S routes from the SMUs can be routed through separate pads and separate routes on-chip so that the Kelvin'd node points N1, N2 and N3 between F and S occur directly at the test circuit. There are several problems with this approach. The voltage supply from each SMU can only adjust for one circuit at a time. To measure two or more circuits simultaneously, one needs to proportionally dedicate more SMUs, which adds cost and requires many more pads. The electrical circuit within the SMU that adjusts the force voltage according to the sense voltage contains a feedback loop. If the total resistance between the SMU and the Kelvin'd points N1, N2 or N3 is too large, then the feedback loop is corrupted, and the intended voltage is not obtained and/or the SMU could be damaged. Finally, there is a slow response time in correcting the force voltage to obtain the correct sense voltage.

FIG. 7 illustrates another approach where the number of SMUs is doubled. One SMU is dedicated to the F signal and another SMU is dedicated to the S signal. A software feedback loop is used between SMU1 and SMU2, SMU3 and SMU4, and SMU5 and SMU6. This approach resolves the issue of having too much resistance and corrupting the feedback loop in the previous example. The problem with this approach is that a software controller feedback loop is relatively slow compared to the hardware controlled feedback loop in the previous configuration. This approach is also problematic because only one circuit can be measured at a time.

Thus, there is a need for improved power management of test circuits in wafer scribe lines.

SUMMARY OF THE INVENTION

An apparatus has a semiconductor wafer hosting rows and columns of chips, where the rows and columns of chips are separated by scribe lines. Voltage regulators are positioned within the scribe lines. Each voltage regulator is connected to one or more chips. Selection circuitry is positioned within the scribe lines. The selection circuitry governs access to a chip being tested.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
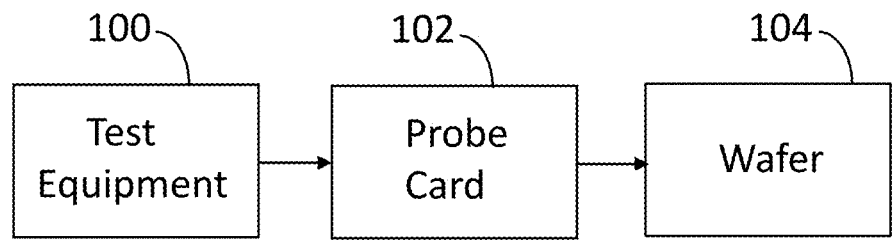
FIG. 1 illustrates a semiconductor wafer testing system known in the prior art.
Figure 2:
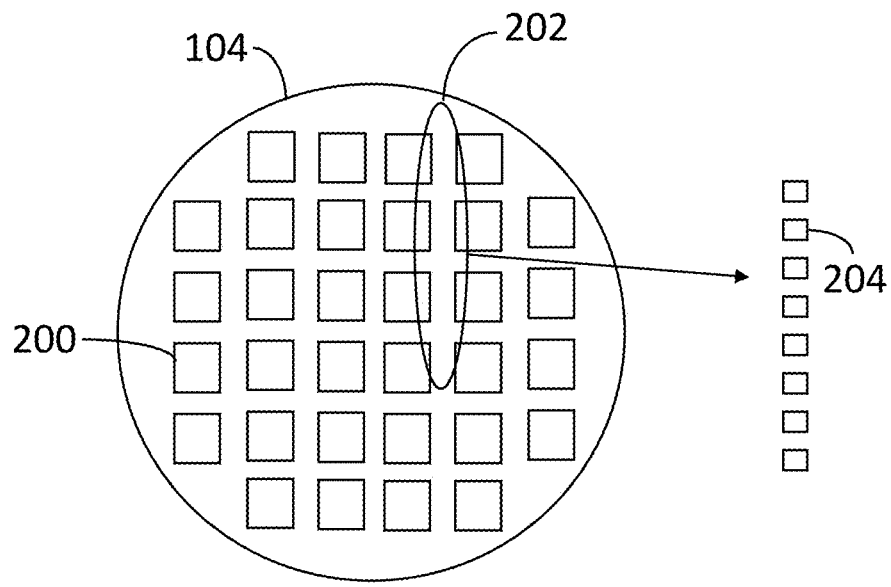
FIG. 2 illustrates a prior art semiconductor wafer with a scribe line hosting test circuits.
Figure 3:
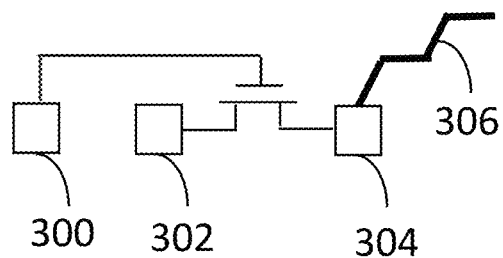
FIG. 3 illustrates a prior art test circuit and associated probe card needle.
Figure 4:
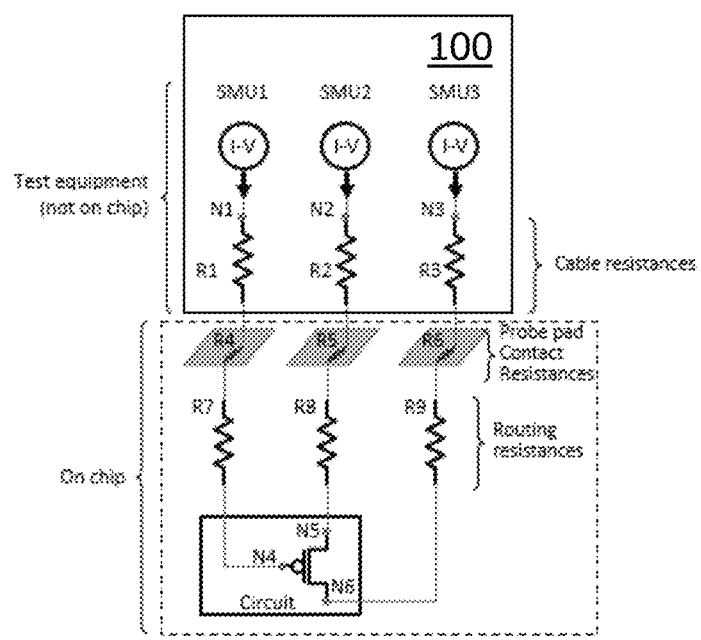
FIG. 4 illustrates a prior art resistance network associated with a test circuit.
Figure 5:
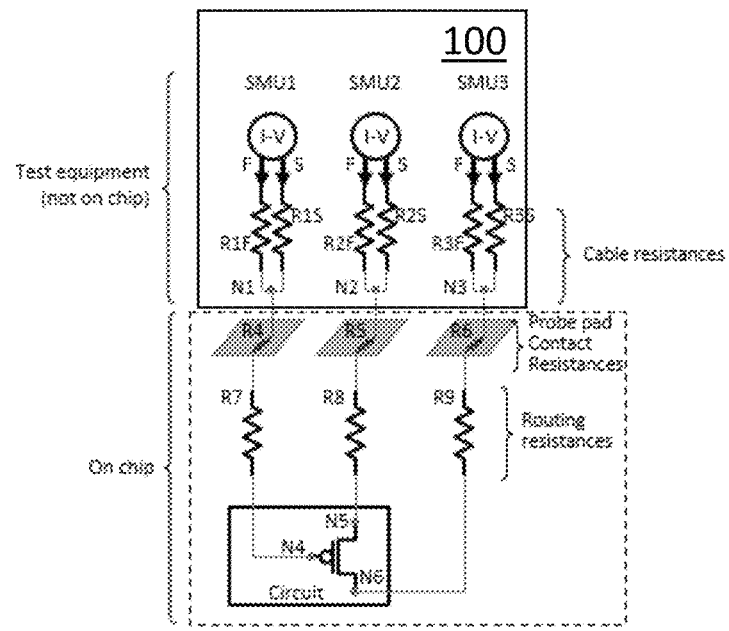
FIG. 5 illustrates prior art force and sense resistance networks associated with a test circuit.
Figure 6:
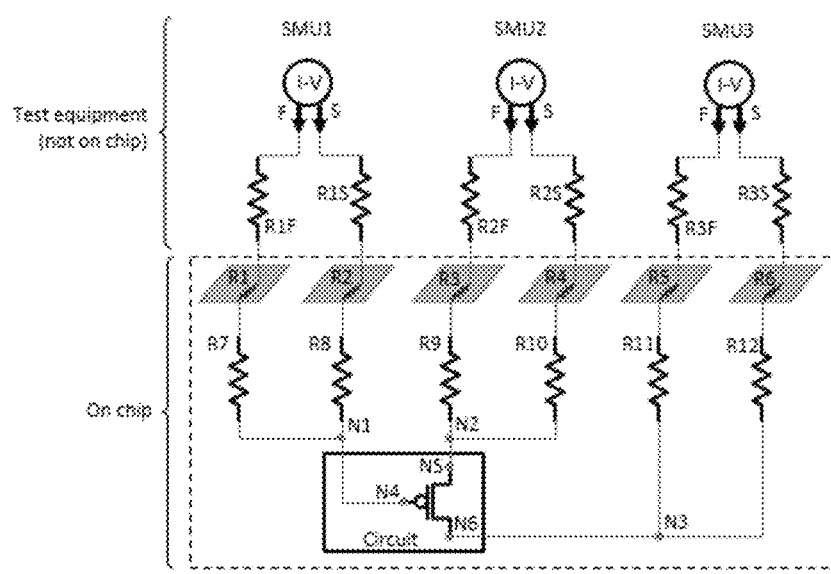
FIG. 6 illustrates prior art expanded force and sense resistance networks associated with a test circuit.
Figure 7:
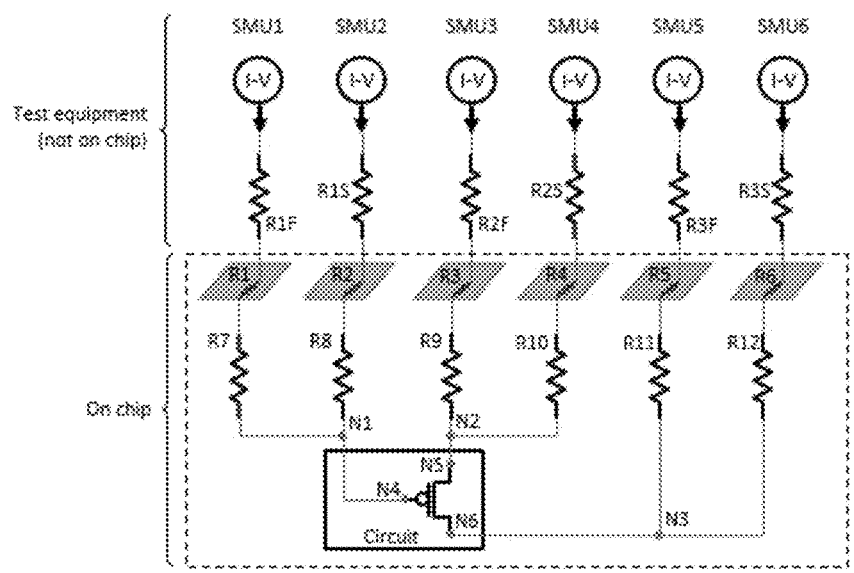
FIG. 7 illustrates another prior art force and sense resistance network.
Figure 8:
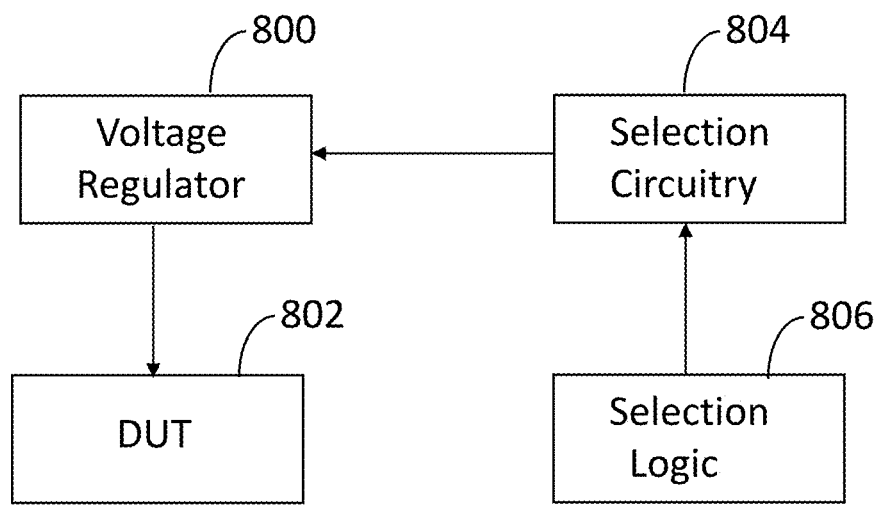
FIG. 8 illustrates elements of the disclosed technology.

FIG. 8 illustrates components of an embodiment of the invention. A voltage regulator 800 is used in connection with a test circuit or Device Under Test (DUT) 802. Access to the voltage regulator 800 or DUT 802 is governed by selection circuitry 804, which is responsive to selection logic 806. The components of FIG. 8 are formed in scribe lines of a wafer, thus they are destroyed after testing.

Figure 9:
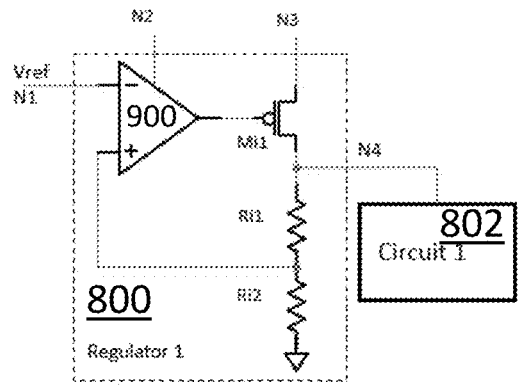
FIG. 9 illustrates a voltage regulator utilized in accordance with an embodiment of the invention.

FIG. 9 illustrates an embodiment of the voltage regulator 800 and its associated test circuit 802. In this embodiment, the intended Vdd supply voltage at node N4 is regulated or controlled by the feedback loop through the resistors Ri1 and Ri2 to the non-inverting input of a differential amplifier 900. Differential amplifier 900 adjusts the Mi1 pMOS gate voltage and thereby the output resistance of the pMOS so that the IR voltage drop from N3 to N4 will be the same as the reference voltage on Node N1. FIG. 9 is an example of a voltage regulator that may be used. Any voltage regulator used to maintain a steady voltage may be deployed. The circuit should be configured so that the resistance of the voltage regulator varies in accordance with both the input voltage and the load, resulting in a constant voltage output. The regulating device is made to act like a variable resistor, continuously adjusting a voltage divider network to maintain a constant output voltage and continually dissipate the difference between the input and regulated voltages as waste heat.

Figure 10:
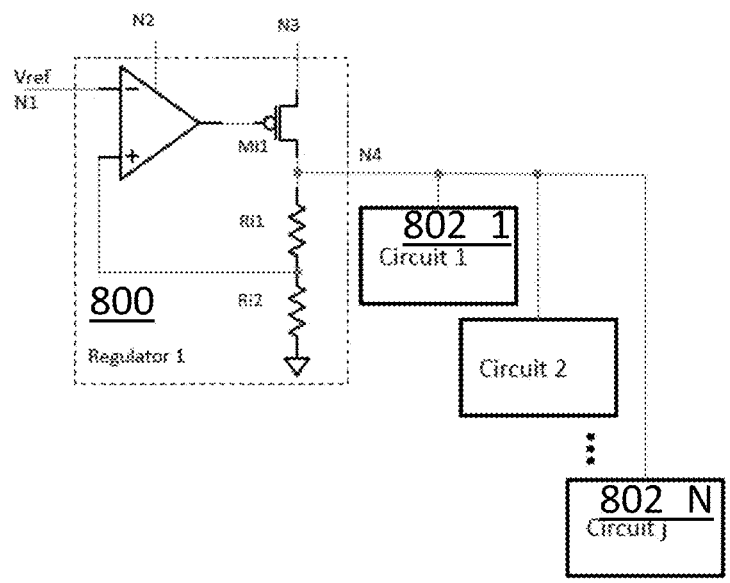
FIG. 10 illustrates a voltage regulator used with a set of circuits in accordance with an embodiment of the invention.

FIG. 10 illustrates voltage regulator 800 associated with a set of test circuits 802_1 through 802_N. The power supply to the feedback circuit and to circuit 802_1 (through nodes N2 and N3) can be combined into a single source. If one wants to measure the current and power going to circuit 802_1, supplies are separated so that one can measure the current flowing through node N3 alone. The current and power to the resistor feedback Ri1 and Ri2 is negligible in comparison to the current and power going to circuit 802_1. If node N4 supplies the power for a group of sensor circuits 802_1 through 802_N, then one cannot measure the current and power for each individual sensor circuit. Consequently, the invention utilizes selection circuitry 804.

Figure 11:
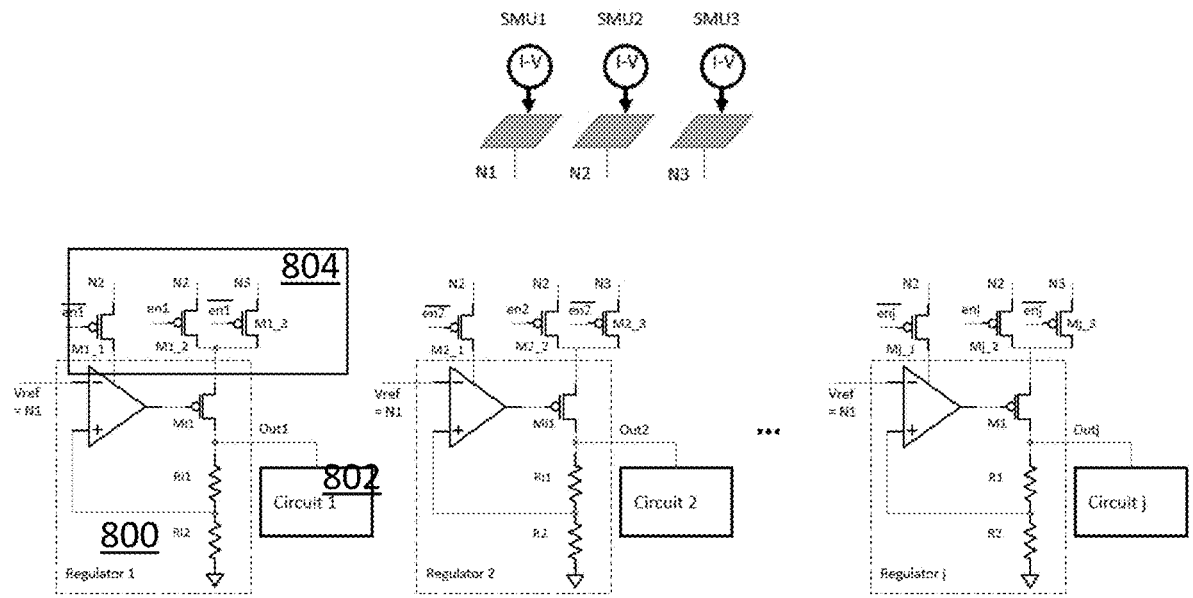
FIG. 11 illustrates voltage regulators and associated selection circuitry utilized in accordance with an embodiment of the invention.

FIG. 11 illustrates an embodiment of the selection circuitry 804. The figure illustrates test circuits 1 through j. The following discussion focuses on the first instance of selection circuit 804, voltage regulator 800 and test circuit 802. Three SMUs from the tester are connected to 3 pads (N1, N2 and N3). These three pads are routed to each circuit, each of which contains its own voltage regulator 800 and its own selection circuitry 804. In this example, the selection circuitry 804 is implemented with three pMOS transistors M1_1 M1_2 and M1_3 above the voltage regulator 800. Through another set of probe pads (not shown) control logic or selection logic 806 selects the enable state of the selection circuitry 804 (en1, en2, enj). When the enable pin switches "high" (i.e., en1=1 or high; en1 is enabled), pMOS transistors M1_1 and M1_3 turn on so that the voltage regulator 800 is powered by SMU2 (N2), which sets up the supply voltage on Out1 to follow the reference voltage from N1 (SMU1) and the circuit 802 is powered by only SMU3. The power and current as measured by SMU3 is the power and current in circuit 802. When en1 is enabled, the remaining enable pins are "low" or off, which means that the power to the voltage regulators is turned off and the power to the sensor circuits comes from N2 (SMU2).

Figure 12:
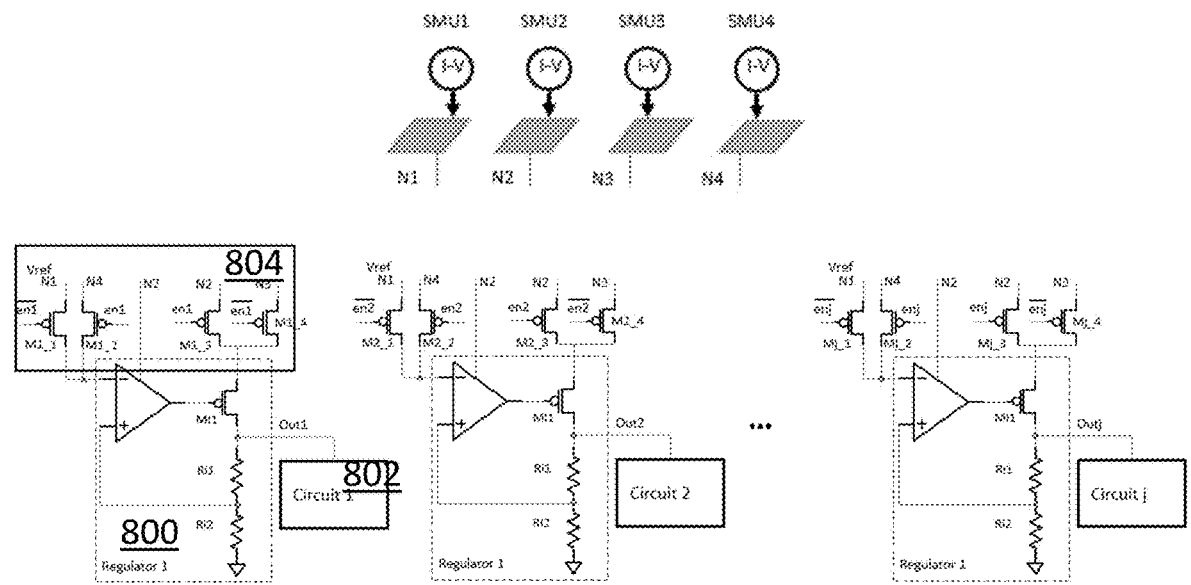
FIG. 12 illustrates voltage regulators and associated selection circuitry utilized in accordance with an embodiment of the invention.

FIG. 12 is a variation of the embodiment of FIG. 11. In FIG. 12, the power to the voltage regulator 800 has a fixed connection to SMU2 (N2) so that the voltage regulators are always running. In this case, however, a second reference voltage can be added to essentially power down the Vdd supplies for sensor circuits that are not enabled (e.g., Out2 . . . Outj are powered down to a low voltage if en1 is selected). This second reference voltage (on node N4) can be provided from another SMU in the tester or it could be a ground or Vss voltage from within the circuit (in which case the MOSFETs in M1_2, M2_2, Mj_2 could be converted to a transmission gate).

Figure 13:
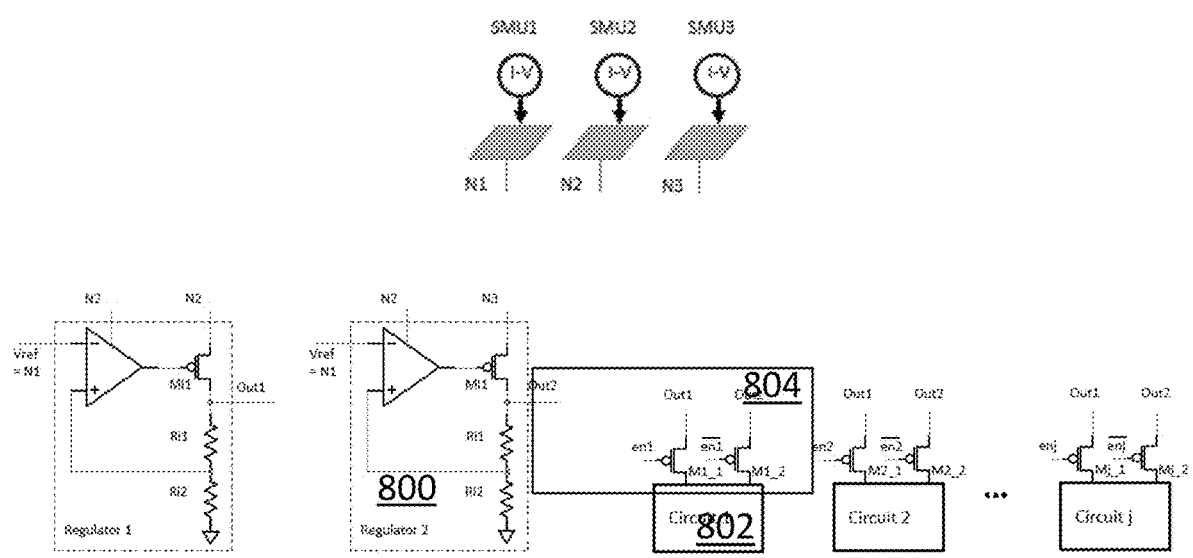
FIG. 13 illustrates voltage regulators and circuit proximate selection circuitry utilized in accordance with an embodiment of the invention.

FIG. 13 illustrates an embodiment of the invention where the selection circuitry 804 is connected to the test circuit 802, not the voltage regulator 800. The embodiments of FIGS. 11 and 12 require a dedicated voltage regulator for each sensor circuit. The voltage regulators can occupy a relatively large area. In FIG. 13, the voltage regulator 800 is shared for all of the sensor circuits. The feedback amplifier in both regulators is powered by SMU2 (N2) and both of the regulator outputs, Out1 and Out2, follow the reference voltage from SMU1 (N1). When the enable is turned on for a particular sensor circuit, the power and current for that sensor circuit comes from SMU3 (N3), while the remaining sensor circuits are powered from SMU2 (N2). In this way, one can measure the power and current in SMU3 as the power and current of the intended sensor circuit.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
a semiconductor wafer hosting rows and columns of chips, where the rows and columns of chips are separated by scribe lines;
voltage regulators positioned within the scribe lines, each voltage regulator being connected to one or more test circuits, the voltage regulators being controlled by a single voltage reference signal that regulates the intended supply voltage; and
selection circuitry positioned within the scribe lines, the selection circuitry governing access to a chip being tested, the selection circuitry utilizing solely pMOS transistors to direct current from the chip being tested to a selected source measurement unit.

2. The apparatus of claim 1 wherein current for a test circuit being tested is isolated from all other test circuits on the semiconductor wafer.

\* \* \* \* \*